United States Patent
Lee et al.

(10) Patent No.: US 7,539,038 B2
(45) Date of Patent: May 26, 2009

(54) NONVOLATILE NANOCHANNEL MEMORY DEVICE USING ORGANIC-INORGANIC COMPLEX MESOPOROUS MATERIAL

(75) Inventors: Kwang Hee Lee, Suwon-si (KR); Won Jae Joo, Hwaseong-si (KR); Jin Heong Yim, Suwon-si (KR); Yoon Sok Kang, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 268 days.

(21) Appl. No.: 11/249,395

(22) Filed: Oct. 14, 2005

(65) Prior Publication Data

US 2006/0208248 A1 Sep. 21, 2006

(30) Foreign Application Priority Data

Mar. 17, 2005 (KR) .................. 10-2005-0022220

(51) Int. Cl.
*G11C 11/00* (2006.01)
*H01L 23/58* (2006.01)
*H01L 21/00* (2006.01)

(52) U.S. Cl. .................. 365/148; 365/163; 257/3; 438/800

(58) Field of Classification Search .......... 257/3, 257/E51.007; 365/148, 163; 438/800
See application file for complete search history.

(56) References Cited

U.S. PATENT DOCUMENTS

| 6,055,180 | A | 4/2000 | Gudesen et al. |
| 6,172,902 | B1 | 1/2001 | Wegrowe et al. |
| 6,632,748 | B2 * | 10/2003 | Yim et al. ............ 438/780 |
| 7,014,917 | B2 * | 3/2006 | Lyu et al. ............ 428/447 |
| 7,144,453 | B2 * | 12/2006 | Yim et al. ............ 106/122 |
| 7,220,982 | B2 * | 5/2007 | Campbell ............ 257/3 |
| 2002/0163057 | A1 | 11/2002 | Bulovic et al. |
| 2003/0166602 | A1 | 9/2003 | Szoka, Jr. |
| 2004/0026729 | A9 * | 2/2004 | Krieger et al. ............ 257/306 |
| 2005/0285095 | A1 * | 12/2005 | Happ ............ 257/2 |
| 2006/0175653 | A1 * | 8/2006 | Joo et al. ............ 257/314 |
| 2007/0102673 | A1 * | 5/2007 | Durrant et al. ............ 252/500 |

FOREIGN PATENT DOCUMENTS

CN 1500846 A 6/2004

(Continued)

OTHER PUBLICATIONS

"The preparation of nanoporous siloxane films using saccharide derivatives as new porogen", Thin Solid Films, vol. 476, (2005), pp. 46-50, (available online Nov. 5, 2004).*

(Continued)

*Primary Examiner*—Evan Pert
(74) *Attorney, Agent, or Firm*—Buchanan Ingersoll & Rooney PC

(57) ABSTRACT

A memory device of the current invention includes a memory layer having nanochannels sandwiched between an upper electrode and a lower electrode, in which the memory layer is made of an organic-inorganic complex for use in formation of nanopores, and has metal nanoparticles or metal ions fed into the nanopores. Therefore, the memory device has excellent processability, high reproducibility, and uniform performance.

26 Claims, 3 Drawing Sheets

FOREIGN PATENT DOCUMENTS

JP          62-95882          5/1987

OTHER PUBLICATIONS

"Preparation of Siloxane-Silsesquioxane Hybrid Thin Films for Large-Scale-Integration Interlayer Dielectrics with Excellent Mechanical Properties and Low Dielectric Constants", J. Appl. Polym. Sci., vol. 90, Iss. 3, p. 626-634.*

R.S. Potember et al., "Electrical Switching and memory Phenomena in Cu-TCNQ Thin Film", Appl. Phys. Lett. 34(6), Mar. 15, 1979, pp. 405-407.

Himadri S. Majumdar et al., "Conductance Switching and Data-Storage in Oriented Polymer-Based Devices: Impedance Characteristics", Science Direct, Thin Solid Films 446, 2004, pp. 296-300.

Himadri S. Majumdar, et al., "Data-storage Devices Based on Layer-by-Layer Self-Assembled Films of a Phthalocyanine Derivative", Science Direct, Organic Electronics 4, 2003, pp. 39-44.

Anirban Bandyopadhyay et al., "Large Conductance Switching and Memory Effects in Organic Molecules for Data-Storage Applications", Applied Physics Letters, vol. 82, No. 8, Feb. 24, 2003, pp. 1215-1217.

Chineses Office Action issued in Application No. 2006100050805, on Jun. 20, 2008.

* cited by examiner

<Al upper electrode>

NONVOLATILE NANOCHANNEL MEMORY DEVICE USING ORGANIC-INORGANIC COMPLEX MESOPOROUS MATERIAL

CROSS-REFERENCE TO RELATED PATENT APPLICATION

This application claims the benefit of Korean Patent Application No. 10-2005-22220, filed on Mar. 17, 2005, in the Korean Intellectual Property Office, the disclosure of which is incorporated herein in its entirety by reference.

BACKGROUND OF THE INVENTION

1. Field of the Invention

Embodiments of the present invention relate, generally, to a nonvolatile nanochannel memory device using an organic-inorganic complex mesoporous material, and, more particularly, to a memory device, comprising a memory layer having nanochannels sandwiched between an upper electrode and a lower electrode, in which the memory layer is made of an organic-inorganic complex for use in formation of nanopores and having metal nanoparticles or metal ions fed into the nanopores.

2. Description of the Related Art

Recently, with the rapid development of the information and communication industries, the demand for various memory devices has drastically increased. In particular, memory devices required for portable terminals, various smart cards, electronic money, digital cameras, games, MP3 players, etc. must be nonvolatile, so that the recorded information is not lost even when power is turned off.

As techniques for large scale integration (LSI) have been developed, the number of bits of memory integrated in IC chips reaches the level of megabits, and thus, line and space widths having sub-micrometer sizes are required. Although almost all conventional nonvolatile memory devices are manufactured using standard silicon technology, the silicon-based device thus manufactured has shortcomings, such as a complicated structure and a large-sized single memory cell, so that high memory capacity is difficult to realize. Manufacturing silicon-based memory having a high memory capacity with high integration requires a fining process, capable of decreasing line and space widths per unit area which results in high costs of manufacturing memory chips. Moreover, current manufacturing techniques of the chips do not allow them to be further miniaturized, and hence, profitability problems are now being faced.

Therefore, vigorous attempts have been made to develop next-generation memory devices, which have ultrahigh speeds, high capacities and low power consumption suitable for the development of portable information and communication systems and apparatuses to wirelessly handle large amounts of information, instead of conventional memory devices. The next-generation memory devices include, for example, ferroelectric RAM, magnetic RAM, phase change RAM, nanotube RAM, holographic memory, organic memory, etc., depending on the kind of material constituting a unit cell in a semiconductor. Of these memory devices, organic memory achieves memory capability, using bistable voltage values obtained by applying voltage to an organic material provided between upper and lower electrodes. Thus, organic memory may overcome the problems of processability, manufacturing costs and integration regarded as disadvantages of conventional flash memory, while exhibiting the nonvolatile characteristics which are the advantage of flash memory. Therefore, organic memory is widely expected to be the next-generation memory technology.

In this regard, Potember et al., USA, in 1979, first reported a memory phenomenon, as well as electrical switching at a speed on the nano-second scale, using CuTCNQ (7,7,8,8-tetracyano-p-quinodimethane) as a charge transfer complex containing an organic metal [Appl. Phys. Lett., 34 (1979) 405]. Japanese Patent Laid-open Publication No. Sho. 62-956882 discloses an electrical memory device using CuTCNQ. However, the above memory device can be manufactured only by thermal deposition using an expensive evaporator, instead of a simple process such as spin coating, due to the use of a monomer as a raw material, and hence, has no advantage in terms of processability.

As an organic material showing electrical bistability upon the application of an electrical field, a conducting polymer, other than a charge transfer material, is also known [Thin Solid Film, 446 (2004) 296-300]. In addition, memory properties obtained by using a phthalocyanin compound as an organic dye have been reported [Organic Electronics, 4 (2003) 39-44]. In addition, switching/memory properties due to conformational change under oxidation-reduction and electrical field are known [Applied Physics Letter, 82 (2003) 1215].

U.S. Pat. App. Pub. No. 2002-163057 discloses a semiconductor device including a middle layer made of a mixture comprising an ionic salt such as NaCl or CsCl and a conducting polymer, interposed between upper and lower electrodes. Such a device manifests switching/memory properties using charge separation under an electrical field. Although the conducting polymer may be used for spin coating, its molecular weight and distribution are difficult to accurately control. Thus, reproducibility of the material is problematic, and uniform performance of the device cannot be realized.

In addition, U.S. Pat. No. 6,055,180 discloses a memory device using ferroelectricity depending on a crystalline phase of a fluorine-based polymer, such as poly(vinyldifluoroethylene). However, the fluorine-based polymer is difficult to apply due to hydrophobic properties of fluorine, thus having decreased processability. Also, the above patent is disadvantageous in that because the information may be recorded only once and the stored information may be optically read, the size of the device increases and the structure thereof becomes complicated.

In addition, U.S. Pat. App. Pub. No. 2003-166602 discloses a memory device including an active layer in which a plurality of nanochannels or nanopores for use in charge transfer are present, without the need for a conventional semiconductor material. However, the above device has a complicated structure, since the charge transfer path is formed of a polymer material and an inactive layer for supplying ions must be present along with the active layer to change the electrical conductivity of the active layer.

Further, a memory device manufactured by Y. Yang, a professor at UCLA, by positioning thin metal nanoclusters between two organic layers, has been reported to have excellent memory properties, which may be understood based on the change of the overall resistance of the device via charge/discharge of the metal nanoclusters functioning as a capacitor, or based on an MIM (Metal/Insulator/Metal) memory phenomenon proposed by J. G. Simmons and R. R. Verderber. In addition, IBM has manufactured a memory device exhibiting an MIM memory phenomenon, using gold particles dispersed in a polymer. As such, the above memory device is characterized in that the gold particles function as a current flow channel.

As mentioned above, the conventionally used organic material having bistability is disadvantageous because it is deposited only by thermal deposition using an expensive evaporator, instead of a simple process such as spin coating, due to the use of a monomer as a raw material. The conducting polymer may undergo spin coating. However, accurate molecular weight and distribution thereof are difficult to obtain. Thus, the reproducibility of the material is problematic, resulting in nonuniform performance of the device. In the cases where the metal nanoparticles are deposited into a layer between the organic materials or are dispersed in the polymer, the current flow paths become random and thus are uncontrollable, consequently obtaining poor reproducibility and nonuniform performance.

SUMMARY OF THE INVENTION

Accordingly, embodiments of the present invention have been made keeping in mind the above problems occurring in the related art, and an object of embodiments of the present invention is to provide a memory device, which ensures regular charge transfer paths and realizes excellent reproducibility and uniform performance, by forming a mesoporous matrix thin film using an organic-inorganic complex, and feeding metal nanoparticles or metal ions to allow current flow into the pores to form a memory layer having nanochannels.

According to one aspect to accomplish the above object, embodiments of the present invention provide a memory device comprising a memory layer having nanochannels in which metal nanoparticles or metal ions are fed, sandwiched between an upper electrode and a lower electrode.

According to another aspect to accomplish the above object, embodiments of the present invention provide a method of manufacturing an organic memory device comprising a memory layer sandwiched between an upper electrode and a lower electrode, comprising applying the memory layer on the lower electrode using an organic-inorganic complex mesoporous material to form nanochannels; feeding metal nanoparticles or metal ions into the nanochannels; and depositing the upper electrode on the memory layer.

BRIEF DESCRIPTION OF THE DRAWINGS

The above and other objects, features and advantages of embodiments of the present invention will be more clearly understood from the following detailed description taken in conjunction with the accompanying drawings, in which.

DESCRIPTION OF THE PREFERRED EMBODIMENTS

Hereinafter, a detailed description will be given of embodiments of the present invention, with reference to the appended drawings.

Figure 1:
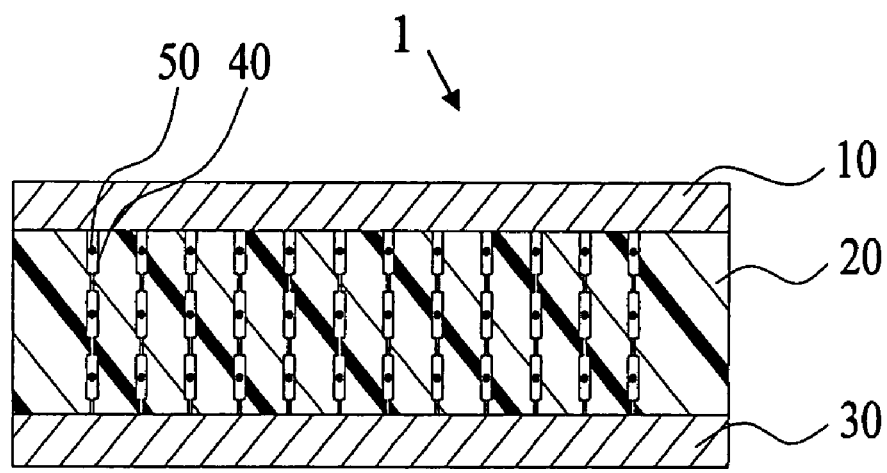
FIG. 1 is a schematic sectional view showing a memory device according to an embodiment of the present invention.

FIG. 1 is a schematic sectional view showing a memory device 1 according to one embodiment of the present invention. As shown in FIG. 1, the memory device 1 is structured in such a way that a memory layer 20 is sandwiched between an upper electrode 10 and a lower electrode 30. Specifically, the memory layer 20 may be made of an organic-inorganic complex mesoporous material, and thus, nanochannels 40 may be formed therein. In addition, metal nanoparticles or metal ions 50 may be fed into the nanochannels 40, thus forming current flow paths. That is, when voltage is applied to the memory device 1, the resistance value of the memory layer may manifest bistability, realizing memory properties. Further, since memory properties, caused by metal nanoparticles or metal ions in a memory layer, may be maintained even without the upper and lower electrodes, a memory device of embodiments of the present invention may exhibit nonvolatile properties.

In embodiments of the present invention, the memory layer 20 of the memory device 1, which includes the nanochannels 40 and various functional materials fed into the nanochannels 40, is designed on a suitable substrate (not shown), such as glass or silicon.

Used in the memory layer 20, the mesoporous material serves as a matrix-forming material to form channels in the matrix. As such, the mesoporous material may include an organic material, or an organic-inorganic complex, but is not limited thereto. Further, a method of forming regular nanopores from an organic-inorganic complex may be described as follows. That is, when an amphiphilic surfactant having hydrophilicity and hydrophobicity is used, microscopic phase separation occurs due to the difference in polarity, and thus, micelles are formed, thereby obtaining a self-assembled structure. Hence, a mesoporous thin film having regular pores of various sizes and structures may be formed by changing concentrations and controlling the molecular weights of a hydrophilic group and a hydrophobic group.

More preferably, the memory layer may be provided by forming a mesoporous thin film using a pore-forming composition.

In embodiments of the present invention, the pore-forming composition may comprise a thermally stable matrix precursor, a pore-forming material (hereinafter, called a 'porogen'), and a solvent dissolving the above materials.

The thermally stable matrix precursor, which may be included in the composition of embodiments of the present invention, may include an inorganic polymer or an organic polymer having a glass transition temperature of 400° C. or more.

The inorganic polymer may includes (1) silsesquioxane, (2) a condensate of alkoxysiliane, (3) organic silicate obtained by organically changing the composition of $RSiO_3$ or $R_2SiO_2$ (wherein R is an organic substituent), or (4) partially condensed orthosilicate having the composition of $SiOR_4$ (wherein R is an organic substituent), each of which has silicon, carbon, oxygen and hydrogen.

The organic polysiloxane-based silsesquioxane may include, for example, hydrogen silsesquioxane, alkyl silsesquioxane, aryl silsesquioxane, or copolymers of silsesquioxane. As such, alkyl silsesquioxane may include methyl silsesquioxane, ethyl silsesquioxane, propyl silsesquioxane, etc., and aryl silsesquioxane may include phenyl silsesquioxane, but is not limited thereto. The copolymers of silsesquioxane may include a copolymer of hydrogen silsesquioxane and phenyl silsesquioxane, a copolymer of methyl silsesquioxane and ethyl silsesquioxane, a copolymer of methyl silsesquioxane and vinyl silsesquioxane, etc., but are not limited thereto.

The condensate of alkoxysilane means a material obtained by partially condensing alkoxysilane to have a number average molecular weight ranging from 500 to 20,000, in which alkoxysiliane may be exemplified by tetraethoxysilane, tetramethoxysilane, etc.

In the organic silicate, $RSiO_3$ or $R_2SiO_2$ in which R is an alkyl group, such as a methyl group, an ethyl group, a propyl group, etc., may be used.

In the orthosilicate, $SiOR_4$ in which R is an alkyl group, such as a methyl group, an ethyl group, a propyl group, etc., may be used.

The thermally stable organic matrix precursor may include an organic polymer to be cured to have a reticulate structure stable to a high temperature, and may be exemplified by polyimides resulting from imidization of poly(amic acid), poly(amic acid ester), etc., polybenzocyclobutenes, or polyarylenes, such as polyphenylene or poly(arylene ethers).

The matrix precursor used in embodiments of the present invention preferably includes an organic polysiloxane resin having high solubility, which may be prepared by subjecting a cyclic siloxane monomer alone or a mixture of the siloxane monomer to hydrolysis and condensation in the presence of an acid catalyst, or by selectively adding a silane monomer to the siloxane monomer and then hydrolyzing and condensing them. As such, the amount of Si—OH of the organic siloxane resin is preferably in the range of 10 mol % or more, and preferably, 25 mol % or more. When the amount of Si—OH of the organic siloxane resin is 10 mol % or more, a composition having sufficient mechanical strength may be achieved, and as well, compatibility with the porogen used in embodiments of the present invention is improved.

A cyclic siloxane monomer which may be used in the preparation of the matrix precursor of embodiments of the present invention, has a cyclic structure having a silicon atom linked via an oxygen atom, has an organic group for forming a hydrolyzable substituent at its terminal, and is represented by Formula 1 or 2, below:

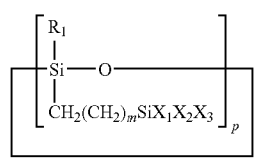

Formula 1 wherein $R_1$ is a hydrogen atom, a $C_1$ to $C_3$ alkyl group, or a $C_6$ to $C_{15}$ aryl group; $X_1$, $X_2$ and $X_3$ are each independently a hydrogen atom, a $C_1$ to $C_3$ alkyl group, a $C_1$ to $C_{10}$ alkoxy group, or a halogen atom, at least one of which is a hydrolyzable functional group; and m is an integer ranging from 0 to 10, and p is an integer ranging from 3 to 8; and

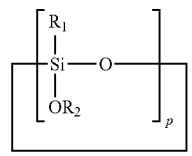

Formula 2 wherein $R_1$ is a hydrogen atom, a $C_1$ to $C_3$ alkyl group, or a $C_6$ to $C_{15}$ aryl group; $R_2$ is a hydrogen atom, a $C_1$ to $C_{10}$ alkyl group, or $SiX_1X_2X_3$ (in which $X_1$, $X_2$ and $X_3$ are each independently a hydrogen atom, a $C_1$ to $C_3$ alkyl group, a $C_1$ to $C_{10}$ alkoxy group, or a halogen atom); and p is an integer ranging from 3 to 8.

Although a method of preparing such a cyclic siloxane monomer is not particularly limited, the monomer may be prepared through hydrogen silylation using a metal catalyst.

As the cyclic siloxane monomer, a commercially available siloxane monomer having a halogen group as a terminal functional group may be used unchanged, or may be used after converting the terminal halogen group into an alkyl group or an alkoxy group, if necessary. The conversion method is not particularly limited, as long as it does not impede the object of embodiments of the present invention. In addition, any method known in the art may be used. For example, in the case where the terminal halogen group is converted into an alkoxy group, it may be reacted with alcohol and triethylamine.

Specifically, a monomer represented by Formula 3 below, obtained when $R_1$ is a methyl group, $X_1$, $X_2$, and $X_3$ are each a methoxy group, m is 1, and p is 4 in Formula 1, or a monomer represented by Formula 4 below, obtained when $R_1$ is a methyl group, $R_2$ is $Si(OCH_3)$, and p is 4 in Formula 2, may be exemplified:

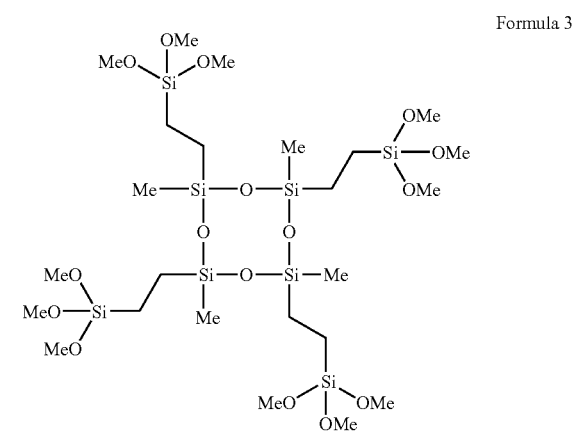

Formula 3

Formula 4

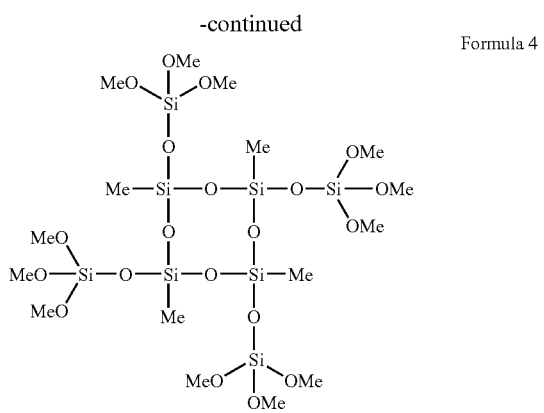

A silane monomer which may be used in the polymerization of the matrix precursor of embodiments of the present invention includes an organic group for forming a hydrolyzable substituent at its terminal, and is represented by Formula 5 below:

$$RSiX_1X_2X_3 \quad \text{Formula 5}$$

wherein R is a hydrogen atom, a $C_1$ to $C_3$ alkyl group, a $C_3$ to $C_{10}$ cycloalkyl group, a $C_1$ to $C_{10}$ alkoxy group or a $C_6$ to $C_{15}$ aryl group; $X_1$, $X_2$ and $X_3$ are each independently a $C_1$ to $C_3$ alkyl group, a $C_1$ to $C_{10}$ alkoxy group, or a halogen atom.

Specific examples of the silane monomer include methyltrimethoxysilane represented by Formula 6 below, phenyltrimethoxysilane, tetramethoxysilane, etc., but are not limited thereto:

Formula 6

To achieve the object of embodiments of the present invention, more preferably, the monomer represented by Formula 3 and the monomer represented by Formula 6 may be polymerized at a molar ratio of 0.01:0.99-0.99:0.01, or the monomer represented by Formula 4 and the monomer represented by Formula 6 are polymerized at a molar ratio of 0.01:0.99-0.99:0.01, thus preparing a matrix precursor of embodiments of the present invention.

The conditions of hydrolysis and condensation for preparation of the matrix precursor of embodiments of the present invention may be as follows. Although the acid catalyst used is not particularly limited, it preferably includes hydrochloric acid, benzenesulfonic acid, oxalic acid, nitric acid, formic add, or mixtures thereof. Water used in the hydrolysis and condensation may be used in 1.0-100.0 equivalents, and preferably, 1.0-10.0 equivalents, based on the equivalent of the reactive group in the monomer.

The reaction temperature may range from 0 to 200° C., and preferably, from 50 to 110° C., and the reaction time may be controlled in a range from 1 to 100 hr, and preferably, from 5 to 48 hr.

The composition of embodiments of the present invention may include cyclodextrin compounds represented by Formulas 7 to 10 below and a calix arene compound represented by Formula 11 below, as a porogen:

Formula 7

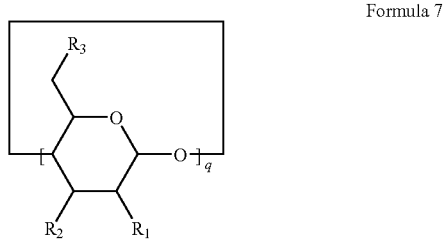

wherein q is an integer ranging from 6 to 12, $R_1$ to $R_3$ are each independently a halogen atom, a $C_0$ to $C_{10}$ amino or azido group, a $C_3$ to $C_{20}$ imidazole group or pyridine group, a $C_1$ to $C_{10}$ cyano group, a $C_2$ to $C_{10}$ carbonate group, a $C_1$ to $C_{10}$ carbamate group, or a functional group represented by —$OR_4$ (in which $R_4$ is a hydrogen atom, a halogen atom, a $C_2$ to $C_{30}$ acyl group, a $C_1$ to $C_{20}$ alkyl group, a $C_3$ to $C_{10}$ alkene group, a $C_3$ to $C_{20}$ alkyne group, a $C_7$ to $C_{20}$ tosyl group, a $C_1$ to $C_{10}$ mesyl group, a $C_0$ to $C_{10}$ amino group or azido group, a $C_0$ to $C_{10}$ phosphoryl group, a $C_3$ to $C_{20}$ imidazole group or pyridine group, a $C_3$ to $C_{10}$ cycloalkyl group, a $C_6$ to $C_{30}$ aryl group, a $C_1$ to $C_{20}$ hydroxyalkyl group or carboxyl group, a $C_1$ to $C_{20}$ carboxyalkyl group, a $C_6$ to $C_{12}$ glucosyl group or maltosyl group, a $C_1$ to $C_{10}$ cyano group, a $C_2$ to $C_{10}$ carbonate, a $C_1$ to $C_{10}$ carbamate group, or a silicon compound represented by $Sir_1r_2r_3$ in which $r_1$, $r_2$ and $r_3$ are each independently a $C_1$ to $C_5$ alkyl group, a $C_1$ to $C_5$ alkoxy group, or a $C_6$ to $C_{20}$ aryl group);

Formula 8

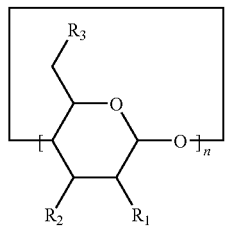

wherein n is an integer ranging from 3 to 10, $R_1$ and $R_2$ are each a crosslinked structure formed from a substituent represented by OH, SH, or $NH_2$, $R_3$ is a compound represented by —$OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group, a carboxy group, or a silicon (Si) compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group);

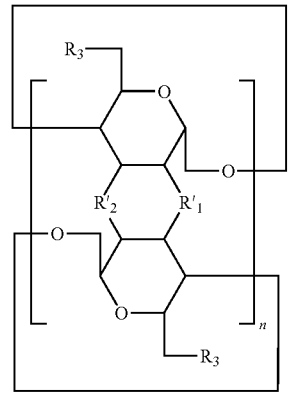

Formula 9 wherein n is an integer ranging from 3 to 10, $R_{1'}$ and $R_{2'}$ are each a crosslinked structure formed from a substituent represented by OH, SH, or $NH_2$, $R_3$ is a compound represented by $-OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group or carboxyl group, or a compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_1$ to $C_{20}$ aryl group);

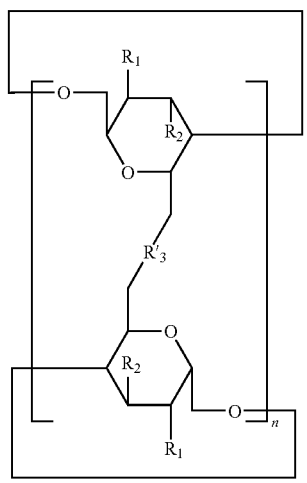

Formula 10 wherein n is an integer ranging from 3 to 10, $R_{3'}$ is a crosslinked structure formed from a substituent represented by OH, SH, or $NH_2$, $R_1$ and $R_2$ are each a compound represented by $-OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group, a $C_1$ to $C_{20}$ carboxyl group, or a silicon compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group);

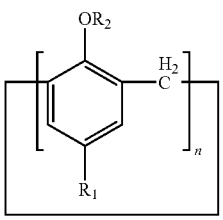

Formula 11 wherein n is an integer ranging from 3 to 10, $R_1$ is a $C_1$ to $C_{20}$ alkyl group, and $R_2$ is H, a $C_2$ to $C_{30}$ acyl group, a $C_1$ to $C_{20}$ alkyl group, a $C_3$ to $C_{10}$ cycloalkyl group, a $C_1$ to $C_{20}$ carboxy group, a $C_1$ to $C_{20}$ ester group, or a silicon (Si) compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group.

Another porogen usable in embodiments of the present invention includes saccharide derivatives having 1, 2 or fewer than 20 hexose derivatives. Examples thereof may include monosaccharides, such as a glucose derivative represented by Formula 12 below, a galactose derivative represented by Formula 13 below, or a fructose derivative represented by Formula 14 below:

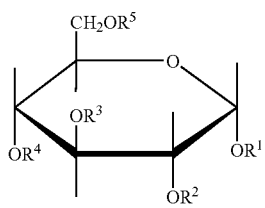

Formula 12

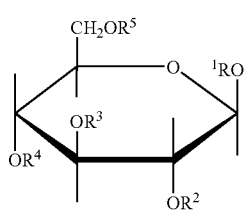

Formula 13

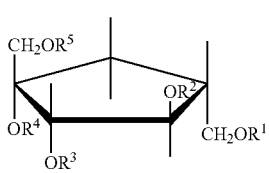

Formula 14 in Formulas 12 to 14, $R^1$, $R^2$, $R^3$, $R^4$, and $R^5$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkyl group.

A further porogen may be exemplified by disaccharides, such as a lactose derivative represented by Formula 15 below, a maltose derivative represented by Formula 16 below, or a sucrose derivative represented by Formula 17 below:

Formula 15

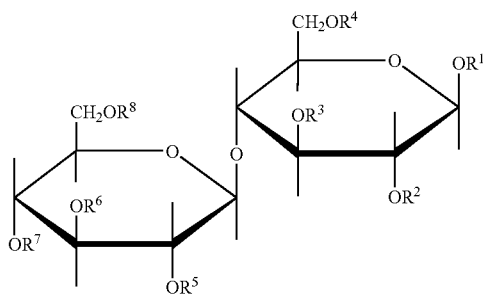

Formula 16

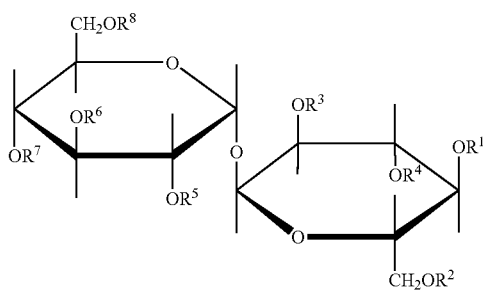

Formula 17

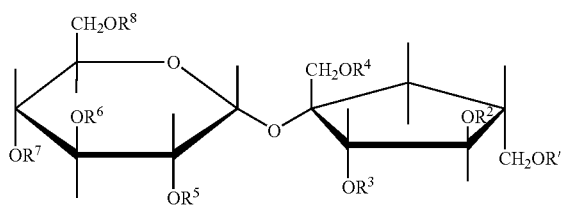

in Formulas 15 to 17, $R^1, R^2, R^3, R^4, R^5, R^6, R^7$, and $R^8$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkyl group.

Still a further porogen may be exemplified by polysaccharides, such as a maltodextrin represented by Formula 18 below:

Formula 18

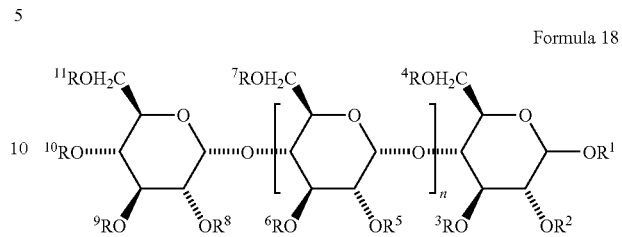

wherein $R^1, R^2, R^3, R^4, R^5, R^6, R^7, R^8, R^9, R^{10}$, and $R^{11}$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkyl group.

Specific examples of the porogen include may glucose, glucopyranose pentabenzoate, glucose pentaacetate, galactose, galactose pentaacetate, fructose, sucrose, sucrose octabenzoate, sucrose octaaoetate, maltose, lactose, etc., but are not limited thereto.

In addition, a porogen usable to form a more arranged mesoporous thin film in embodiments of the present invention includes a silyl modified porogen prepared by subjecting a pore-forming material having a hydroxy group at its terminal and a halogenized silane compound to substitution reaction in the presence of an amine base catalyst.

More specifically, the silyl modification reaction may be effectively carried out over several hours by reacting the silane compound with a terminal hydroxy group of the pore-forming material having a hydroxy group at its terminal in the presence of an amine base catalyst. In this case, the base catalyst is not limited, but preferably includes triethylamine. The reaction temperature may be in a range from 0 to 200° C., and preferably, from room temperature to 110° C. The reaction time may range from 1 to 100 hr, and preferably, from 2 to 24 hr.

The pore-forming material having a hydroxy group at its terminal may be at least one selected from among a polyethylene-polyethylene oxide block copolymer represented by Formula 19 below, a polyethylene oxide-polypropylene oxide block copolymer represented by Formula 20 below, a polyethylene oxide-polypropylene oxide-polyethylene oxide triblock copolymer represented by Formula 21 below, a cyclodextrin derivative represented by Formula 22 below, and polycaprolactone dendrimer represented by Formula 23 below:

Formula 19

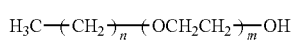

Formula 20

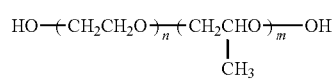

Formula 21

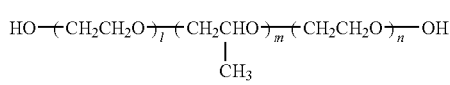

Formula 22

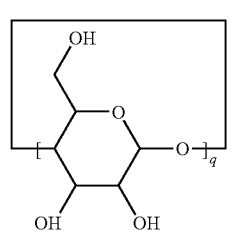

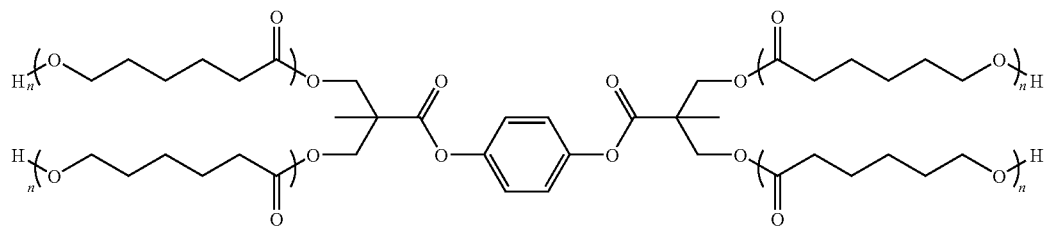

Formula 23 in Formulas 19 to 23, l is an integer ranging from 2 to 200, m is an integer ranging from 20 to 80, n is an integer ranging from 2 to 200, and q is an integer ranging from 5 to 8.

A preferable halogenized silane compound used in the silyl modification includes compounds represented by Formulas 24 to 27, below:

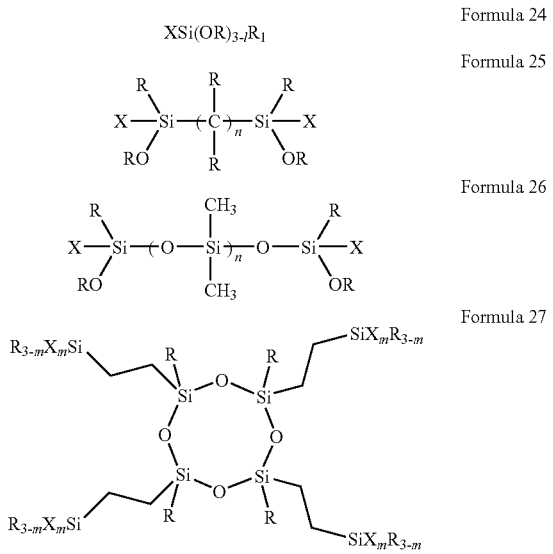

in Formulas 24 to 27, R is independently a hydrogen atom, a $C_2$ to $C_{30}$ acyl group, a $C_1$ to $C_5$ alkyl group or a $C_3$ to $C_6$ cycloalky group, X is a halogen atom, such as a fluorine (F) atom, a chlorine (Cl), a bromine (Br) atom, or an iodine (I) atom, l is an integer ranging from 0 to 3, m is an integer ranging from 0 to 3, and n is an integer ranging from 1 to 10.

In the composition for use in the formation of the memory layer of embodiments of the present invention, the solvent for dissolving the solid components (matrix precursor+pore-forming material) is not particularly limited, but may include aromatic hydrocarbons, such as anisole, xylene, or mesitylene; ketones, such as methyl isobutyl ketone, 1-methyl-2-pyrrolidinone, or acetone; ethers, such as tetrahydrofuran, or isopropyl ether; acetates, such as ethyl acetate, butyl acetate, or propyleneglycol monomethylether acetate; amides, such as dimethylacetamide, or dimethylformamide; γ-butyrolactones; alcohols, such as isopropyl alcohol, butyl alcohol, or octyl alcohol; silicon solvents; or mixtures thereof.

The solvent should be provided in a sufficient amount so that the matrix precursor has a concentration required to be applied on a substrate, and is preferably used in an amount of 20 to 99.9 wt %, and more preferably, 70 to 95 wt %, based on the total weight of the composition. If the amount of the solvent is less than 20 wt %, the precursor may not completely dissolve in the solvent. Meanwhile, if the amount of the solvent exceeds 99.9 wt %, the resulting thin film may have a thickness of 100 Å or less. In addition, the porogen may be used in an amount of 0.1-95 parts by weight, and preferably, 10 to 70 parts by weight, based on 100 parts by weight of the matrix precursor.

In embodiments of the present invention, the composition for use in the formation of the memory layer may be formed into a mesoporous nanochannel memory layer, according to the following processes.

First, a composition for use in forming a memory layer of embodiments of the present invention may be applied on a lower electrode via spin coating, dip coating, spray coating, flow coating or screen printing. More preferably, it may be applied via spin coating at 1000-5000 rpm. After the application of the composition, the solvent is evaporated from the coated substrate, thus forming a thin film deposited on the lower electrode. As such, a means suitable for evaporation, including simple air drying by exposure to surrounding environment, or applying vacuum or weak heating upon an initial curing, may be used.

The thin film thus formed may heated to a temperature at which a porogen is thermally decomposed, preferably, 150 to 600° C., and more preferably, 200 to 450° C., to be cured, thus forming an insoluble film without cracks. When the coated thin film is heated, an inert gas atmosphere, such as nitrogen or argon, or a vacuum atmosphere may be applied. In this case, the curing time may be maximally 10 hr, and preferably, ranges from 30 min to 1 hr.

In this way, the memory layer formed by using the mesoporous material may have nanopores formed therein. As such, the nanopores may function as a channel in which metal nanoparticles or metal ions that enable charge transfer are present, and thus, may cause a device of embodiments of the present invention to realize the memory properties. The channel preferably has a size from 0.5 to 100 nm.

Particularly, a memory device of embodiments of the present invention is advantageous in that because the metal nanoparticles or metal ions are present in the nanochannels of the memory layer, charge transfer paths may be regularly formed, thus manifesting excellent reproducibility and uniform performance.

The memory layer preferably has a thickness from 50 nm to 100 μm.

In the memory layer, the metal nanoparticles or metal ions may be fed in such a manner that they are randomly arranged or arranged perpendicular to the surface of the upper or lower electrode, depending on the shape of the nanochannel of the matrix. Further, the metal nanoparticles or metal ions in the nanochannels may cause the resistance values of the device to have bistability, corresponding to the applied voltage, to realize the memory properties of a memory device of embodiments of the present invention. Furthermore, since they function as a charge transfer path in a memory device of embodiments of the present invention, a conducting polymer, a semiconducting polymer, or a semiconducting inorganic material need not be additionally included. As a specific material acting as the charge transfer path, nanoparticles or ions of aluminum, gold, silver, platinum, copper, or indium tin oxide may be exemplified, but are not limited thereto. The metal nanoparticle size is not particularly limited, but is preferably 10 nm or less.

The metal nanoparticles or metal ions may be fed into the nanochannels in the matrix according to various processes. Specifically, the metal nanoparticles or metal ions may be simply directly fed over the memory layer having nanochannels using vacuum deposition. In particular, in the case where the nanochannel has an open pore structure, the above process is more effective. In some cases, when the upper electrode is deposited, particles or ions of metal for the electrode may be fed into the pores via metal diffusion. In this way, the process of feeding metal nanoparticles or metal ions is not additionally performed, and may be simultaneously performed when the upper electrode is formed on the memory layer. Alternatively, a polymer having metal situated thereon may be fed into the nanochannel, or a functional material may be deposited on the nanochannel using CVD as an additional process.

The amount or distribution of the fed metal nanoparticles or metal ions may be controlled depending on the kinds of metal and the memory properties, and also, may be more easily controlled by forming a barrier layer between the memory layer and the electrode. In particular, in the case where the metal nanoparticles or metal ions are fed into the nanochannels via diffusion while the upper electrode is deposited using vacuum deposition, the formation of the barrier layer between the memory layer and the upper electrode makes it easier to control the amount and the distribution of the metal nanoparticles or metal ions.

Figure 2A:
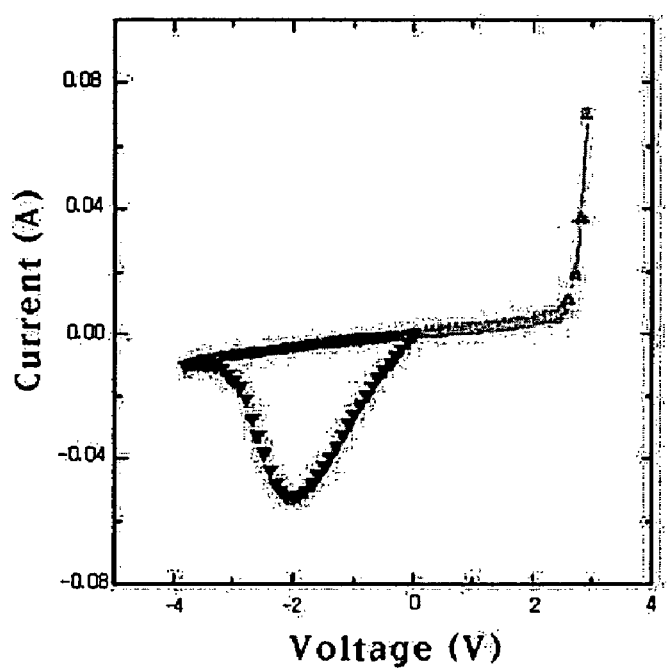
FIGS. 2a and 2b are current-voltage graphs showing bell type memory phenomenon and fast switching type memory phenomenon, respectively, of a memory device of an embodiment of the present invention.
Figure 2B:
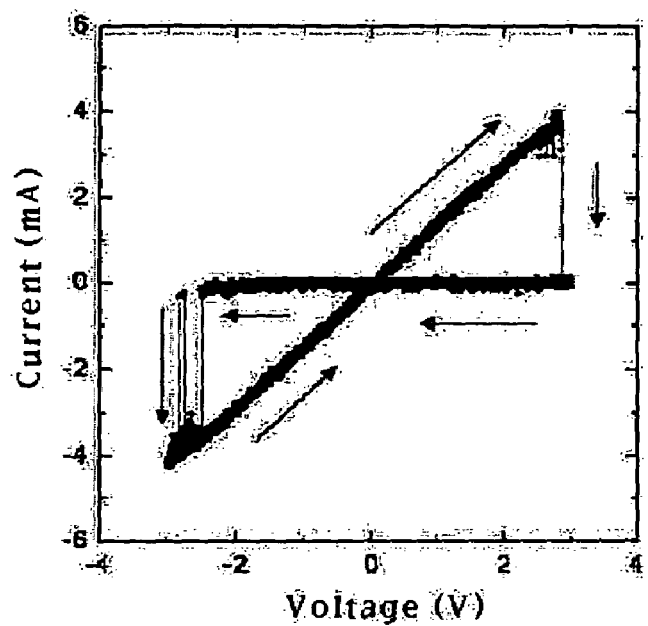

As mentioned above, in the memory device of embodiments of the present invention, the fed metal nanoparticles or metal ions may be caused to form current flow paths and manifest memory properties. Specifically, when the metal nanoparticles in the matrix are distributed perpendicular to the electrode, a negative differential resistance phenomenon occurs and thus bell type nonvolatile memory properties may be realized, as shown in FIG. 2a. In addition, when the metal ions drift in the matrix, fast switching type nonvolatile memory properties may be exhibited, due to the formation of metal filaments or the generation of a short circuit, as shown in FIG. 2b.

In embodiments of the present invention, the upper electrode 10 and the lower electrode 30 may be formed, independently, of at least one electrically conductive material selected from the group consisting of metals, metal alloys, metal nitrides, metal oxides, metal sulfides, carbon, conducting polymers, and organic conductors, but are not limited thereto. Specifically, the electrode material includes, for example, aluminum, gold, silver, platinum, copper, titanium, tungsten, or indium tin oxide. The upper metal material may act as metal nanoparticles or metal ions in the nanochannels of the memory layer via the metal diffusion using vacuum deposition.

While the relationship in current-voltage of the memory device varies with the material for the upper electrode, the memory properties may be controlled.

In a preferred embodiment of the present invention, the memory device of the present invention may further include a barrier layer on the lower electrode or below the upper electrode, to protect the electrode and control the amount and distribution of the metal nanoparticles or metal ions fed into the nanochannels. That is, before the upper electrode is deposited, the material for the barrier layer is deposited even in the nanochannels formed in the memory layer, decreasing the diameter of the nanochannel. As a result, upon the subsequent formation of the upper electrode, the amount of the metal nanoparticles or metal ions included in the nanochannels may be controlled.

Although the material for the barrier layer is not particularly limited, it may be at least one selected from the group consisting of a conducting polymer, a nonconducting polymer, a mesoporous material mentioned as those usable in the memory layer, an organic monomer or an inorganic material able to form a thin film using vacuum deposition, and mixtures thereof.

Preferably, the conducting polymer may be at least one homopolymer or copolymer selected from the conducting polymer group consisting of poly(n-vinylpyridine), poly(dimethylsiloxane), poly(ethylene-oxide), poly(acrylic acid), poly(methylacrylic acid), poly(styrene-sulfonic acid), poly(cyclopentadienylmethyl-norbornene), and poly(amino acid). The nonconducting polymer may be at least one homopolymer or copolymer selected from the group consisting of polymethylmethacrylate (PMMA), polystyrene (PS), polyimide (PI), and polycarbonate (PC). Also, the mesoporous material may include any material as long as it is different from that used in the memory layer. Examples thereof may include thin films prepared by using siloxane or silsesquioxane as a matrix material and using cyclodextrin, a calix arene compound, or dendrimer as a pore-forming material. The more regularly arranged mesoporous material may include mesoporous thin films prepared by using a silica matrix or a triblock copolymer of polyethyleneoxide-polypropyleneoxide-polyethyleneoxide (PEO-PPO-PEO) as a matrix and using a surfactant as a pore-forming material. In addition, in the case where the barrier layer is formed on the mesoporous thin film, if the barrier layer is formed of the same material as the memory layer, it connects the lower memory layer, and thus, metal feeding may not be controlled and the thickness of the memory layer may be increased. Thus, it is preferable that a material having a smaller pore size and lower porosity than the memory layer be selected to easily control the metal feeding. The organic monomer able to form a thin film using vacuum deposition may comprise acetylene, Alq3 (8-hydroxyquinoline aluminum), or TPD (N,N-diphenyl-N,N'-bis(3-methylphenyl)-1,1'-biphenyl-4,4'-diamine).

The thickness of the barrier layer preferably ranges from 0.1 to 100 nm.

A better understanding of embodiments of the present invention may be obtained in light of the following examples which are set forth to illustrate, but are not to be construed to limit the embodiments of present invention.

EXAMPLE 1

A memory device was manufactured as follows. First, Al serving as a lower electrode was deposited to a thickness of 80 nm on a glass substrate having a size of 50×50 mm$^2$ using thermal deposition.

Then, an organic-inorganic complex matrix precursor for use in manufacturing an organic-inorganic complex thin film having nanopores was manufactured according to the following procedures. That is, into a flask, 41.6 mmol (10.00 g) 2,4,6,8-tetramethyl-2,4,6,8-cyclotetrasiloxane was loaded, and then diluted with 100 ml of tetrahydrofuran (THF), and added with 700 mg of 10 wt % Pd/C (palladium on charcoal).

Subsequently, 177.8 mmol (3.20 ml) distilled water was added, and the generated hydrogen gas was removed. The reaction was conducted at room temperature for 5 hr, after which the reaction solution was filtered through a celite and MgSO$_4$. The filtrate was placed under a reduced pressure of about 0.1 torr to remove volatile material, and 41.6 mmol (12.6 g) compound thus obtained was diluted with 200 ml of THF, and then added with 177.8 mmol (13.83 g) triethylamine. After the temperature of the above solution was decreased to 0° C., 177.8 mmol (25.0 g) chlorotrimethoxysilane was slowly added, and the temperature was gradually increased to room temperature and then allowed to react for 12 hr. The reaction solution was filtered via a celite, and the filtrate was placed under a reduced pressure of about 0.1 torr to remove volatile material, and then concentrated, thus preparing a colorless liquid monomer.

The 5.09 mmol monomer and 45.81 mmol methyltrimethoxysilane (MTMS, available from Aldrich) were loaded into a flask, and then diluted with THF to a concentration of 0.05 to 0.07 M, after which the reaction temperature was controlled to −78° C. Into the above flask, 1.985 mmol hydrochloric acid and 661.6 mmol water were loaded, and the reaction temperature was gradually increased from −78° C. to 70° C., and allowed to react for 16 hr. The reaction solution was transferred into a separate funnel, after which diethylether and THF were added in the same amount as that of initially added THF. The obtained solution was washed three times with water of an amount corresponding to 1/10 of the total amount of the solvent, and volatile material was removed under a reduced pressure, yielding white powdery polymer. This polymer was dissolved in THF to prepare a transparent solution, which was then filtered using a 0.2 μm filter. Water was slowly added to the filtrate to precipitate white powder. The white powder was dried at 0 to 20° C. under a pressure of 0.1 torr for 10 hr, yielding 4.4 g of a siloxane polymer B. Amounts of Si—OH and Si—OCH$_3$ were 28.20% and 0.90%, respectively. In addition, the amount of Si—CH$_3$ was 70.90%.

The siloxane resin matrix precursor, heptakis(2,3,6-tri-O-methyl)-β-cyclodextrin serving as a pore-forming material, and propylene glycol methyl ether acetate serving as a solvent were mixed at a composition ratio of 2.1:0.9:97 wt %, to prepare a composition for use in formation of a mesoporous thin film.

The composition thus prepared was applied on the Al lower electrode deposited on the glass substrate at 2000 rpm using spin coating. The substrate coated with the siloxane resin was sequentially soft-baked at 150° C. for 10 min and then 250° C. for 10 min using a hot plate, to remove organic solvent. The substrate thus manufactured was cured in a Linberg furnace at 400° C. for 60 min in a vacuum atmosphere, thus forming a thin film.

Figure 3:
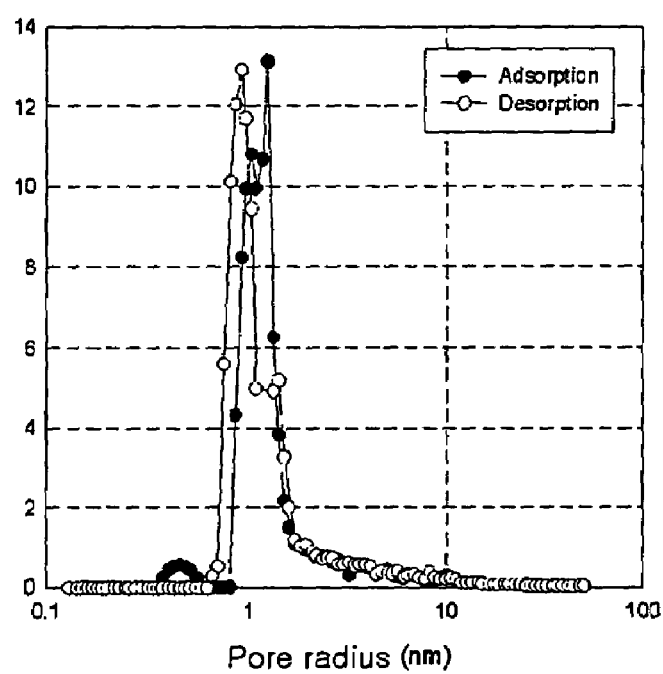
FIG. 3 is a graph showing the pore size distribution of a memory layer thin film obtained using an organic-inorganic complex mesoporous material.

The pore size of the thin film was measured using an EP (Ellipsometric Porosimetry), and was confirmed to have a radius of about 0.98-1.05 nm. A pore size distribution graph is shown in FIG. 3.

Figure 4:
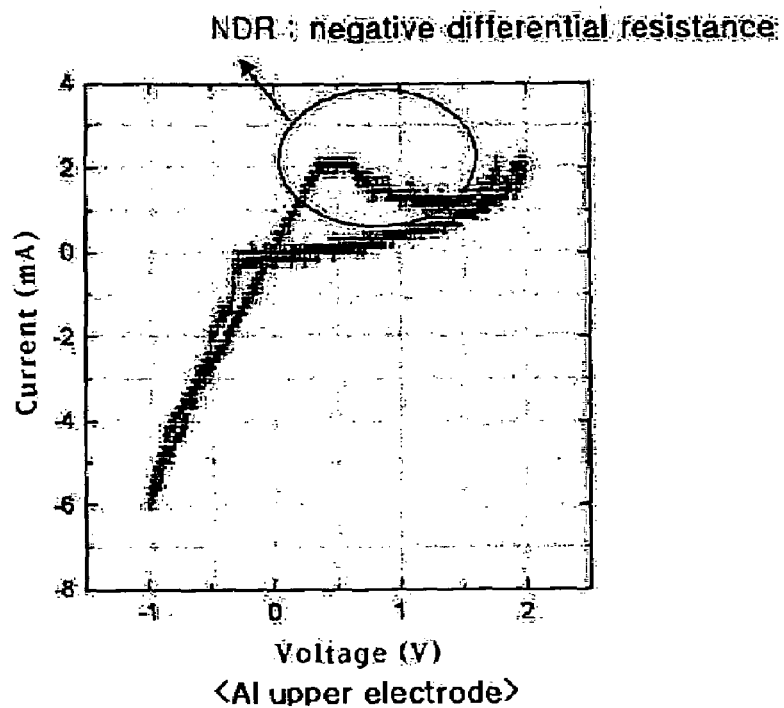
FIG. 4 is a current-voltage graph showing the memory properties of a memory device using Al as an upper electrode in Example 1.

On the film thus manufactured, polythiophene was applied to a thickness 20 nm via spin coating, after which Al was formed as an upper electrode using a thermal vacuum deposition process. As such, the electrode was 80 nm thick, and the memory cell had a size of 1×1 mm$^2$. The I-V graph of the memory device is shown in FIG. 4. As shown in FIG. 4, negative differential resistance (NDR) which causes a current to drop occurred in the range of about 0.5 to 1.3 V, and thus, the resistance value was switched to be high (reset state). Even if the voltage was reduced, a reset state was maintained. When the current was drastically increased at −0.3 V, resistance was decreased and hence entered a set state. In addition, a low resistance state, which was maintained even at continuous scans, was switched due to the NDR.

EXAMPLE 2

Figure 5:
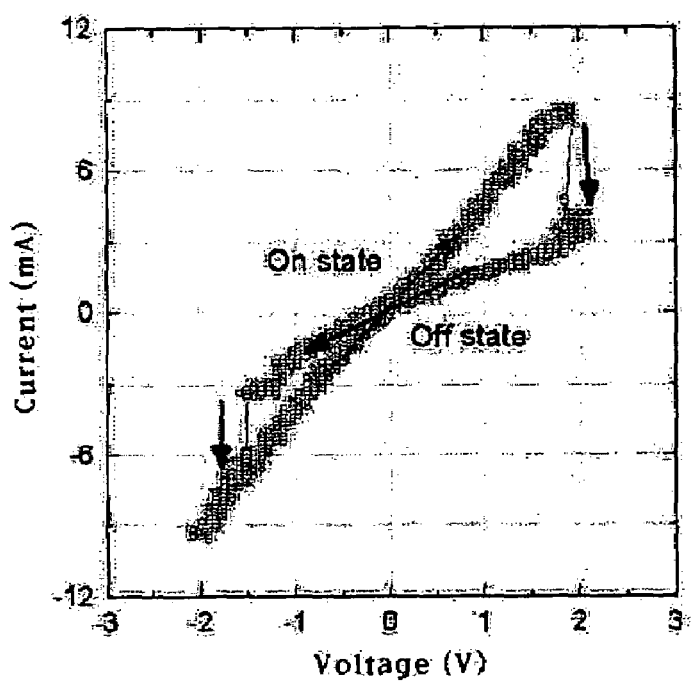
FIG. 5 is a current-voltage graph showing the memory properties of the memory device using Au as an upper electrode in Example 2.

A memory device was manufactured in the same manner as in Example 1, with the exception that an upper electrode was formed of Au. The I-V graph showing memory properties of the device is shown in FIG. 5. As confirmed in the I-V graph, when the upper electrode was formed of Au, fast switching occurred. That is, low resistance was switched to high resistance at +2 V, resulting in a reset state. On the other hand, high resistance was switched to low resistance at −1.5 V, exhibiting a set state. The resistance values of two states were measured at 453Ω and 230Ω, respectively. The two different resistance states may be read even at a low reading voltage, and thus, the device may be used as a memory device.

As described hereinbefore, embodiments of the present invention provide a nonvolatile nanochannel memory device using an organic-inorganic complex mesoporous material. A memory device using a mesoporous material of embodiments of the present invention has nonvolatile properties, and excellent integration, and thus, realizes high capacity and is easily manufactured, therefore decreasing the manufacturing cost. In addition, since metal nanoparticles or metal ions are present in the nanochannels, charge transfer paths are regular, so the device has excellent reproducibility and uniform performance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising:
   an upper electrode;
   a lower electrode; and
   a memory layer,
   wherein the memory layer is disposed between the upper electrode and the lower electrode and comprises an organic-inorganic complex mesoporous material having nanochannels, wherein metal nanoparticles or metal ions are within the nanochannels,
   wherein the mesoporous material is formed from a composition comprising a thermally stable matrix precursor, a pore-forming material, and a solvent for dissolving the matrix precursor and the pore-forming material, and
   wherein the thermally stable matrix precursor is a siloxane resin prepared by hydrolyzing and condensing a compound represented by Formula 1 or 2, below, and a monomer represented by Formula 5, below, using an acid catalyst and water in the presence of an organic solvent:

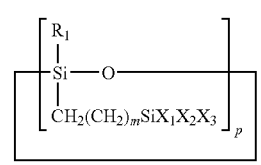

Formula 1 wherein R$_1$ is a hydrogen atom, a C$_1$ to C$_3$ alkyl group, or a C$_6$ to C$_{15}$ aryl group; X$_1$, X$_2$ and X$_3$ are each independently a hydrogen atom, a $C_1$ to $C_3$ alkyl group, a $C_1$ to $C_{10}$ alkoxy group, or a halogen atom, at least one of which is a hydrolyzable functional group; and m is an integer ranging from 0 to 10, and p is an integer ranging from 3 to 8; and

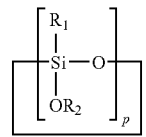

Formula 2 wherein $R_1$ is a hydrogen atom, a $C_1$ to $C_3$ alkyl group, or a $C_6$ to $C_{15}$ aryl group; $R_2$ is a hydrogen atom, a $C_1$ to $C_{10}$ alkyl group, or $SiX_1X_2X_3$ (in which $X_1$, $X_2$ and $X_3$ are each independently a hydrogen atom, a C1 to $C_3$ alkyl group, a $C_1$ to $C_{10}$ alkoxy group, or a halogen atom); and p is an integer ranging from 3 to 8; and

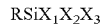

Formula 5 wherein R is a hydrogen atom, a $C_1$ to $C_3$ alkyl group, a $C_3$ to $C_{10}$ cycloalkyl group, a $C_1$ to $C_{10}$ alkoxy group or a $C_6$ to $C_{15}$ aryl group; $X_1$, $X_2$ and $X_3$ are each independently a $C_1$ to $C_3$ alkyl group, a $C_1$ to $C_{10}$ alkoxy group, or a halogen atom.

2. The memory device as set forth in claim 1, further comprising:
   a barrier layer between at least one of a) the memory layer and the lower electrode and b) the memory layer and the upper electrode.

3. The memory device as set forth in claim 1, wherein the thermally stable matrix precursor is a siloxane resin prepared by hydrolyzing and condensing the compound represented by Formula 1 or 2 and the monomer represented by Formula 5 at a molar ratio of 0.01:0.99 to 0.99:0.01.

4. The memory device as set forth in claim 1, wherein the pore-forming material is at least one selected from the group consisting of compounds represented by Formula 7 to 18, below:

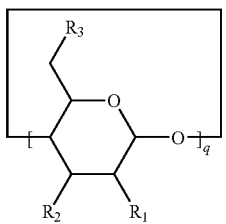

Formula 7 wherein q is an integer ranging from 6 to 12, $R_1$ to $R_3$ are each independently a halogen atom, a $C_0$ to $C_{10}$ amino or azido group, a $C_3$ to $C_{20}$ imidazole group or pyridine group, a $C_1$ to $C_{10}$ a cyano group, a $C_2$ to $C_{10}$ carbonate group, a $C_1$ to $C_{10}$ carbamate group, or a functional group represented by —$OR_4$ (in which $R_4$ is a hydrogen atom, a halogen atom, a $C_2$ to $C_{30}$ acyl group, a $C_1$ to $C_{20}$ alkyl group, a $C_3$ to $C_{10}$ alkene group, a $C_3$ to $C_{20}$ alkyne group, a $C_7$ to $C_{20}$ tosyl group, a $C_1$ to $C_{10}$ mesyl group, a $C_0$ to $C_{10}$ amino group or azido group, a $C_0$ to $C_{10}$ phosphoryl group, a $C_3$ to $C_{20}$ imidazole group or pyridine group, a $C_3$ to $C_{10}$ cycloalkyl group, a $C_6$ to $C_{30}$ aryl group, a $C_1$ to $C_{20}$ hydroxyalkyl group or carboxyl group, a $C_1$ to $C_{20}$ carboxyalkyl group, a $C_6$ to $C_{12}$ glucosyl group or maltosyl group, a $C_1$ to $C_{10}$ cyano group, a $C_2$ to $C_{10}$ carbonate, a $C_1$ to $C_{10}$ carbamate group, or a silicon compound represented by $Sir_1r_2r_3$ in which $r_1$, $r_2$ and $r_3$ are each independently a $C_1$ to $C_5$ alkyl group, a $C_1$ to $C_5$ alkoxy group, or a $C_6$ to $C_{20}$ aryl group);

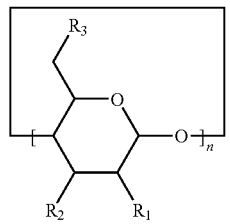

Formula 8 wherein n is an integer ranging from 3 to 10, $R_1$ and $R_2$ are each a crosslinked structure formed from a substituent represented by OH, SH, or $NH_2$, $R_3$ is a compound represented by —$OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group, a carboxy group, or a silicon (Si) compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group);

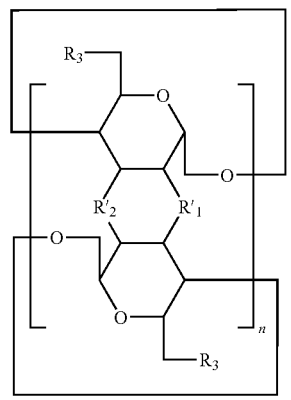

Formula 9 wherein n is an integer ranging from 3 to 10, $R_{1'}$ and $R_{2'}$ are each a crosslinked structure formed from a substituent represented by OH, SH, or $NH_2$, $R_3$ is a compound represented by —$OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group or carboxyl group, or a compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_1$ to $C_{20}$ aryl group);

Formula 10

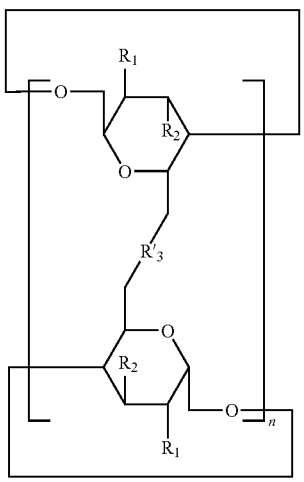

wherein n is an integer ranging from 3 to 10, $R_{3'}$ is a crosslinked structure formed from a substituent represented by OH, SH, or $NH_2$, $R_1$ and $R_2$ are each a compound represented by $—OR_4$ (in which $R_4$ is a $C_2$ to $C_{30}$ acyl group, a $C_1$ to $C_{20}$ alkyl group, a $C_3$ to $C_{10}$ cycloalkyl group, a $C_1$ to $C_{20}$ hydroxyalkyl group, a $C_1$ to $C_{20}$ carboxyl group, or a silicon compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group);

Formula 11

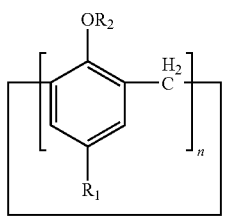

wherein n is an integer ranging from 3 to 10, $R_1$ is a $C_1$ to $C_{20}$ alkyl group, and $R_2$ is H, a $C_2$ to $C_{30}$ acyl group, a $C_1$ to $C_{20}$ alkyl group, a $C_3$ to $C_{10}$ cycloalkyl group, a $C_1$ to $C_{20}$ carboxy group, a $C_1$ to $C_{20}$ ester group, or a silicon (Si) compound represented by $Sir_1r_2r_3$ in which $r_1$, $r_2$, and $r_3$ are each independently a $C_1$ to $C_5$ alkyl group, a $C_1$ to $C_5$ alkoxy group, or a $C_6$ to $C_{20}$ aryl group);

Formula 12

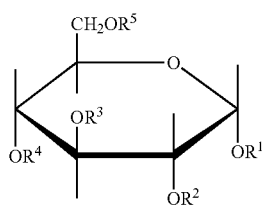

Formula 13

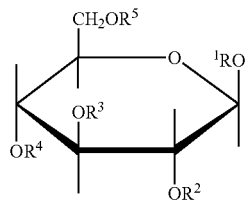

Formula 14

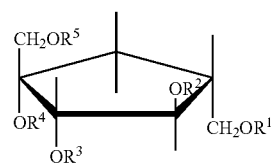

in Formulas 12 to 14, $R^1$, $R^2$, $R^3$, $R^4$, and $R^5$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkyl group;

Formula 15

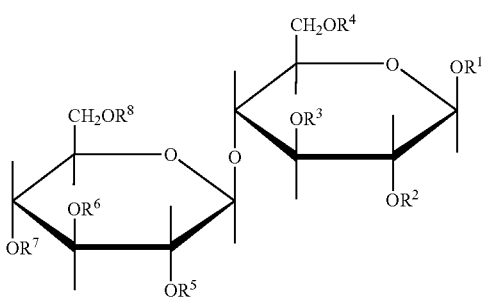

Formula 16

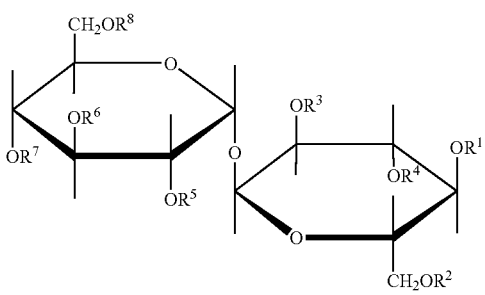

Formula 17

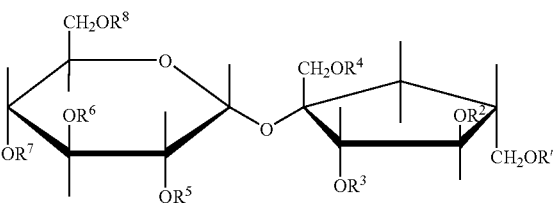

in Formulas 15 to 17, $R^1$, $R^2$, $R^3$, $R^4$, $R^5$, $R^6$, $R^7$, and $R^8$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkykgroup; and Formula 18

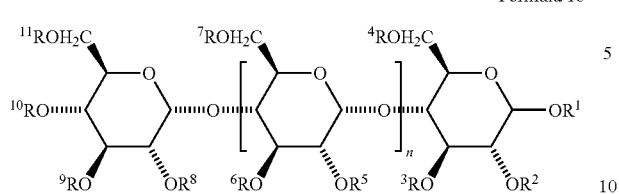

wherein $R^1$, $R^2$, $R^3$, $R^4$, $R^5$, $R^6$, $R^7$, $R^8$, $R^9$, $R^{10}$, and $R^{11}$ are each independently a hydrogen atom, a $C_2$ to $C_{30}$ acyl group, a $C_1$ to $C_{20}$ alkyl group, a $C_3$ to $C_{10}$ cycloalkyl group, a $C_6$ to $C_{30}$ aryl group, a $C_1$ to $C_{20}$ hydroxyalkyl group, or a $C_1$ to $C_{20}$ carboxyalkyl group.

5. The memory device as set forth in claim 1, wherein the pore-forming material is at least one selected from the group consisting of silyl modified porogens, prepared by subjecting a pore-forming material having a hydroxy group at its terminal, represented by Formulas 19 to 23, below, and a halogenized silane compound represented by Formulas 24 to 27, below, to substitution reaction in the presence of an amine base catalyst:

Formula 19

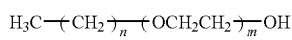

Formula 20

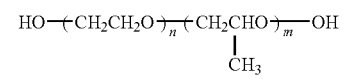

Formula 21

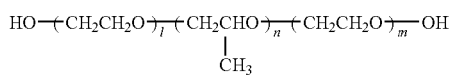

Formula 22

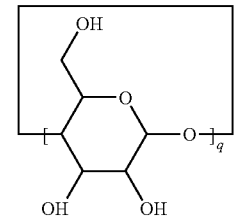

Formula 23

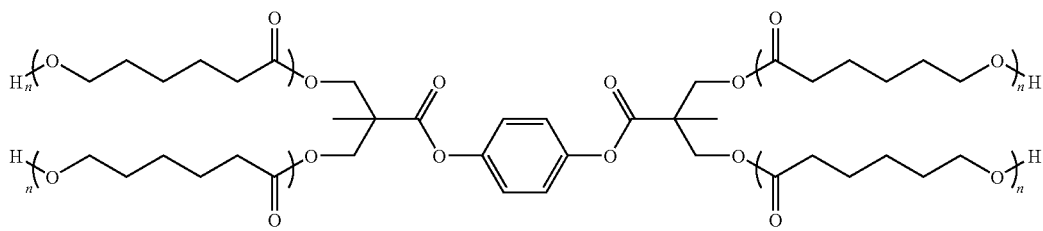

in Formulas 19 to 23, l is an integer ranging from 2 to 200, m is an integer ranging from 20 to 80, n is an integer ranging from 2 to 200, and q is an integer ranging from 5 to 8;

Formula 24

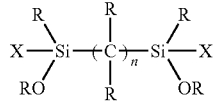

Formula 25

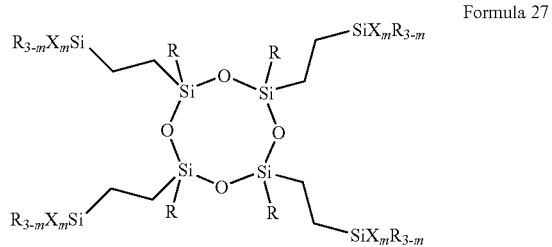

Formula 26

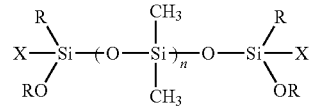

Formula 27

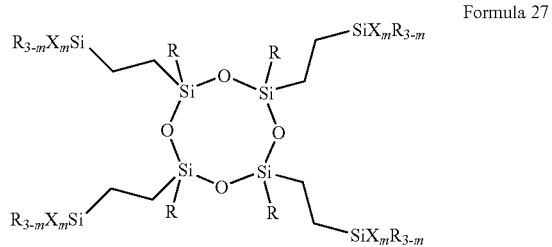

in Formulas 24 to 27, R is independently a hydrogen atom, a $C_2$ to $C_{30}$ acyl group, a $C_1$ to $C_5$ alkyl group or a $C_3$ to $C_6$ cycloalky group, X is a halogen atom comprising a fluorine (F) atom, a chlorine (Cl), a bromine (Br) atom, or an iodine (I) atom, l is an integer ranging from 0 to 3, m is an integer ranging from 0 to 3, and n is an integer ranging from 1 to 10.

6. The memory device as set forth in claim 1, wherein the pore-forming material is present in an amount of 0.1 to 95 wt % of the composition.

7. The memory device as set forth in claim 1, wherein the solvent is present in an amount of 20 to 99.9 wt % of the composition.

8. The memory device as set forth in claim 1, wherein the solvent is selected from the group consisting of aromatic hydrocarbons, ketones, ethers, acetates, amides, γ-butyrolactones, alcohols, silicon solvents, and mixtures thereof.

9. The memory device as set forth in claim 1, wherein the mesoporous material is formed by applying the composition on the lower electrode via spin coating, dip coating, spray coating, flow coating or screen printing, evaporating the solvent, and heating the applied composition at 150-600° C. in an inert gas atmosphere or in a vacuum atmosphere.

10. The memory device as set forth in claim 1, wherein the nanochannels have a size ranging from 0.5 to 100 nm.

11. The memory device as set forth in claim 1, wherein the memory layer has a thickness ranging from 10 nm to 100 μm.

12. The memory device as set forth in claim 1, wherein the metal nanoparticles or metal ions are nanoparticles or ions of a metal selected from the group consisting of aluminum, gold, silver, platinum, and indium tin oxide.

13. The memory device as set forth in claim 1, wherein the metal nanoparticles or metal ions are fed into the nanochannel using thermal deposition.

14. The memory device as set forth in claim 13, wherein the memory device comprises a barrier layer between the memory layer and the upper electrode, and the metal nanoparticles or metal ions are fed into the nanochannel via metal diffusion while the upper electrode is deposited using thermal deposition.

15. The memory device as set forth in claim 2, wherein the barrier layer comprises a material selected from the group consisting of a conducting polymer, a nonconducting polymer, a mesoporous material different from that used in the memory layer, and an organic monomer or inorganic material able to form a thin film using vacuum deposition.

16. The memory device as set forth in claim 14, wherein the barrier layer comprises a material selected from the group consisting of a conducting polymer, a nonconducting polymer, a mesoporous material different from that used in the memory layer, and an organic monomer or inorganic material able to form a thin film using vacuum deposition.

17. The memory device as set forth in claim 15, wherein the conducting polymer comprises at least one homopolymer or copolymer selected from the group consisting of poly(n-vinylpyridine), poly(dimethylsiloxane), poly(ethylene-oxide), poly(acrylic acid), poly(methylacrylic acid), poly(styrenesulfonic acid), poly(cyclopentadienylmethyl-norbornene), and poly(amino acid);

the nonconducting polymer comprises at least one homopolymer or copolymer selected from the group consisting of polymethylmethacrylate (PMMA), polystyrene (PS), polyimide (PI), and polycarbonate (PC);

the mesoporous material different from that used in the memory layer comprises any one selected from the group consisting of thin films prepared by using siloxane or silsesquioxane as a matrix and using cyclodextrin, calix arene, or dendrimer as a pore-forming material, and thin films prepared by using silica or a triblock copolymer of polyethyleneoxide—polypropyleneoxide—polyethyleneoxide (PEO-PPO-PEO) as a matrix and using a surfactant as a pore-forming material; and the organic monomer able to form a thin film using vacuum deposition comprises acetylene, Alq3 (8-hydroxyquinoline aluminum), or TPD (N,N-diphenyl-N,N'-bis(3-methylphenyl)-1,1'-biphenyl-4,4'-diamine).

18. The memory device as set forth in claim 16, wherein the conducting polymer comprises at least one homopolymer or copolymer selected from the group consisting of poly(n-vinylpyridine), poly(dimethylsiloxane), poly(ethylene-oxide), poly(acrylic acid), poly(methylacrylic acid), poly(styrenesulfonic acid), poly(cyclopentadienylmethyl-norbornene), and poly(amino acid);

the nonconducting polymer comprises at least one homopolymer or copolymer selected from the group consisting of polymethylmethacrylate (PMMA), polystyrene (PS), polyimide (PI), and polycarbonate (PC);

the mesoporous material different from that used in the memory layer comprises any one selected from the group consisting of thin films prepared by using siloxane or silsesquioxane as a matrix and using cyclodextrin, calix arene, or dendrimer as a pore-forming material, and thin films prepared by using silica or a triblock copolymer of polyethyleneoxide—polypropyleneoxide—polyethyleneoxide (PEO-PPO-PEO) as a matrix and using a surfactant as a pore-forming material; and the organic monomer able to form a thin film using vacuum deposition comprises acetylene, Alq3 (8-hydroxyquinoline aluminum), or TPD (N,N-diphenyl-N,N'-bis(3-methylphenyl)-1,1'-biphenyl-4,4'-diamine).

19. The memory device as set forth in claim 2, wherein the barrier layer has a thickness ranging from 0.1 to 100 nm.

20. The memory device as set forth in claim 14, wherein the barrier layer has a thickness ranging from 0.1 to 100 nm.

21. The memory device as set forth in claim 1, wherein the upper and lower electrodes comprise, independently, at least one material selected from the group consisting of metals, metal alloys, metal nitrides, metal oxides, metal sulfides, carbon, conducting polymers, and organic conductors.

22. The memory device as set forth in claim 21, wherein the metal is selected from the group consisting of aluminum, gold, silver, platinum, and indium tin oxide.

23. A method of manufacturing an organic memory device comprising an upper electrode, a lower electrode and a memory layer disposed between the upper electrode and the lower electrode, the method comprising:

applying a mesoporous material comprising a thermally stable matrix precursor, a pore-forming material and a solvent for dissolving the precursor and the pore-forming material on a lower electrode, to form a memory layer comprising nanochannels;

feeding metal nanoparticles or metal ions into the nanochannels; and depositing an upper electrode on the memory layer, wherein the thermally stable matrix precursor is a siloxane resin prepared by hydrolyzing and condensing a compound represented by Formula 1 or 2, below, and a monomer represented by Formula 5, below, using an acid catalyst and water in the presence of an organic solvent:

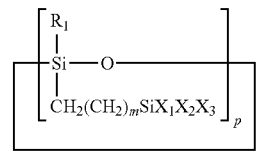

Formula 1 wherein $R_1$ is a hydrogen atom, a $C_1$ to $C_3$ alkyl group, or a $C_6$ to $C_{15}$ aryl group; $X_1$, $X_2$ and $X_3$ are each independently a hydrogen atom, a $C_1$ to $C_3$ alkyl group, a $C_1$ to $C_{10}$ alkoxy group, or a halogen atom, at least one of which is a hydrolyzable functional group; and m is an integer ranging from 0 to 10, and p is an integer ranging from 3 to 8; and

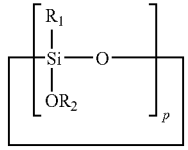

Formula 2 wherein $R_1$ is a hydrogen atom, a $C_1$ to $C_3$ alkyl group, or a $C_6$ to $C_{15}$ aryl group; $R_2$ is a hydrogen atom, a $C_1$ to $C_{10}$ alkyl group, or $SiX_1X_2X_3$ (in which $X_1X_2$ and $X_3$ are each independently a hydrogen atom, a C1 to $C_3$ alkyl group, a $C_1$ to $C_{10}$ alkoxy group, or a halogen atom); and p is an integer ranging from 3 to 8; and $RSiX_1X_2X_3$      Formula 5 wherein R is a hydrogen atom, a $C_1$ to $C_3$ alkyl group, a $C_3$ to $C_{10}$ cycloalkyl group, a $C_1$ to $C_{10}$ alkoxy group or a $C_6$ to $C_{15}$ aryl group; $X_1$, $X_2$ and $X_3$ are each independently a $C_1$ to $C_3$ alkyl group, a $C_1$ to $C_{10}$ alkoxy group, or a halogen atom.

24. The method as set forth in claim 23, wherein the feeding of the metal nanoparticles or metal ions is simultaneously performed via diffusion of the metal nanoparticles or metal ions into the nanochannels of the memory layer when depositing the upper electrode using thermal deposition.

25. The method as set forth in claim 23, further comprising forming a barrier layer between at least one of a) the lower electrode and the memory layer and b) the memory layer and the upper electrode.

26. The method as set forth in claim 24, further comprising forming a barrier layer between at least one of a) the lower electrode and the memory layer and b) the memory layer and the upper electrode.

* * * * *